(12) United States Patent
Lenchenkov et al.

(10) Patent No.: US 9,748,298 B2
(45) Date of Patent: Aug. 29, 2017

(54) IMAGE SENSORS WITH BACKSIDE TRENCH STRUCTURES

(71) Applicant: SEMICONDUCTOR COMPONENTS INDUSTRIES, LLC, Phoenix, AZ (US)

(72) Inventors: Victor Lenchenkov, Sunnyvale, CA (US); Sergey Velichko, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 13 days.

(21) Appl. No.: 14/788,168

(22) Filed: Jun. 30, 2015

(65) Prior Publication Data
US 2017/0005121 A1 Jan. 5, 2017

(51) Int. Cl.
*H01L 27/146* (2006.01)
*H04N 5/369* (2011.01)

(52) U.S. Cl.
CPC ...... *H01L 27/1463* (2013.01); *H01L 27/1464* (2013.01); *H01L 27/14685* (2013.01); *H01L 27/14689* (2013.01); *H04N 5/369* (2013.01); *H01L 27/14612* (2013.01); *H01L 27/14621* (2013.01); *H01L 27/14623* (2013.01); *H01L 27/14627* (2013.01)

(58) Field of Classification Search
CPC ......... H01L 27/14627; H01L 27/14605; H01L 27/14603; H01L 27/14607; H01L 23/485; H01L 27/1464; H01L 27/1463
See application file for complete search history.

(56) References Cited

U.S. PATENT DOCUMENTS

| | | | |
|---|---|---|---|
| 8,405,182 B2 | 3/2013 | Chou et al. | |
| 8,736,006 B1 | 5/2014 | Tsai et al. | |
| 8,962,375 B2 | 2/2015 | Shih et al. | |
| 2009/0057801 A1* | 3/2009 | Goushcha | H01L 27/1443 257/437 |
| 2009/0194671 A1 | 8/2009 | Nozaki et al. | |
| 2011/0019050 A1* | 1/2011 | Yamashita | H01L 27/1463 348/308 |
| 2011/0254115 A1 | 10/2011 | Shih et al. | |
| 2014/0078359 A1 | 3/2014 | Lenchenkov et al. | |
| 2015/0035028 A1 | 2/2015 | Fan et al. | |

OTHER PUBLICATIONS

Lenchenkov, U.S. Appl. No. 14/011,560, filed Aug. 28, 2013.

* cited by examiner

*Primary Examiner* — Ahmed A Berhan
(74) *Attorney, Agent, or Firm* — Treyz Law Group, P.C.; Jason Tsai; David K. Cole (57) ABSTRACT

A backside illumination image sensor with an array of image sensor pixels is provided. Each pixel may include a photodiode, a storage diode, and associated circuitry formed in a front side of a semiconductor substrate. In accordance with an embodiment, a trench isolation structure may be formed directly over the storage diode but not over the photodiode from a back side of the substrate. The backside trench isolation structure may be filled with absorptive material and can optionally be biased to a ground or negative voltage level. A light shielding layer may also be formed over the backside trench isolation structure on the back side of the substrate. The light shielding layer may be formed from absorptive material or reflective material, and may also be biased to a ground or negative voltage level.

18 Claims, 7 Drawing Sheets

IMAGE SENSORS WITH BACKSIDE TRENCH STRUCTURES

BACKGROUND

This relates generally to image sensors, and more specifically, to backside illumination (BSI) image sensors.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology. The image sensors may include photodiodes and other operational circuitry such as transistors formed in a front surface of the substrate. A dielectric stack is formed on the front surface of the substrate directly on top of the photodiodes. The dielectric stack includes metal routing lines and metal vias formed in dielectric material. Light guides are often formed in the dielectric stack to guide the trajectory of incoming light.

A color filter array is formed over the dielectric stack to provide each pixel with sensitivity to a certain range of wavelengths. Microlenses may be formed over the color filter array. Light enters from a front side of the image sensor (i.e., light enters the microlenses and travels through the color filters into the dielectric stack). An image sensor used in this way is referred to as a front-side illumination (FSI) image sensor.

The light guides are used to direct the incoming light towards the photodiodes. The incoming light, however, is sometimes reflected and absorbed by the metal routing lines and vias when traversing the dielectric stack. This results in undesirable pixel crosstalk and signal degradation.

To address these issues, backside illumination image sensors have been developed. These sensors are, however, also subject to crosstalk as stray light that is intended for a given photodiode can still inadvertently leak into regions of the substrate that can potentially corrupt the signal integrity of the image sensor. It is within this context that the embodiments described herein arise.

DETAILED DESCRIPTION

Embodiments of the present invention relate to image sensors, and more particularly, to image sensors with intra-pixel isolation structures. It will be recognized by one skilled in the art, that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices include image sensors that gather incoming light to capture an image. The image sensors may include arrays of imaging pixels. The pixels in the image sensors may include photosensitive elements such as photodiodes that convert the incoming light into image signals. Image sensors may have any number of pixels (e.g., hundreds or thousands of pixels or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
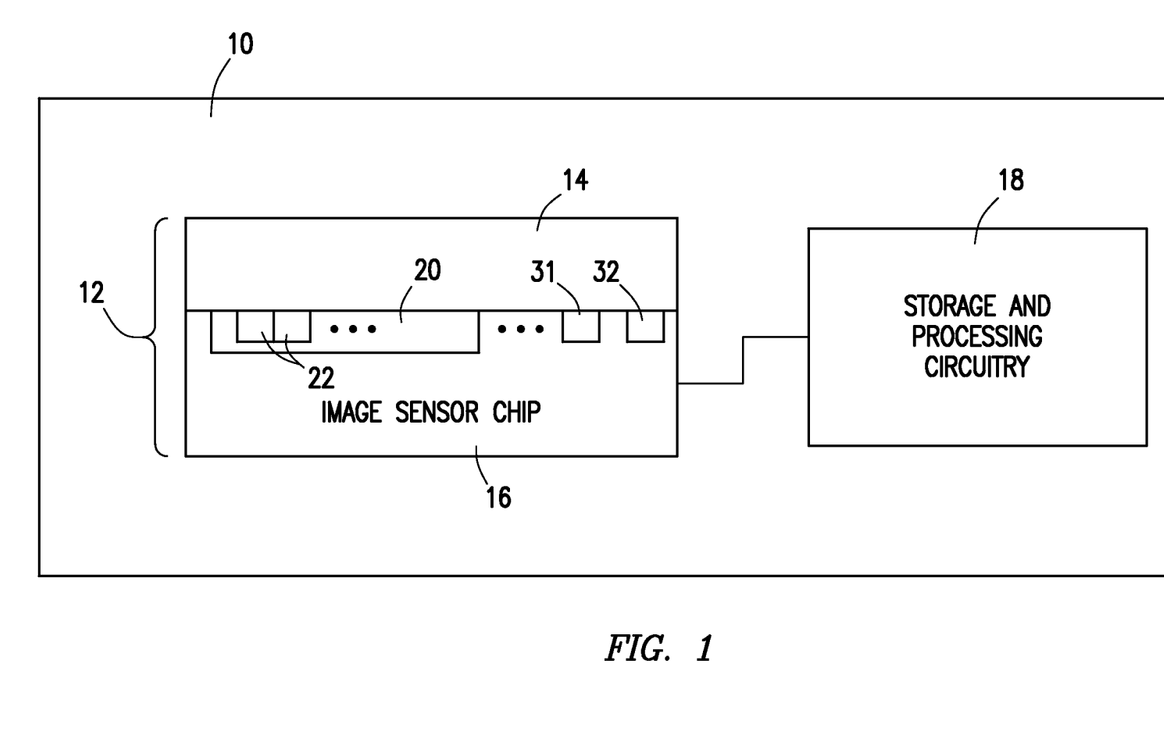
FIG. 1 is a diagram of an illustrative electronic device in accordance with an embodiment.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor system-on-chip (SOC) having additional processing and control circuitry such as analog control circuitry 31 and digital control circuitry 32 on a common image sensor integrated circuit die with image pixel array 20 or on a separate companion die/chip.

During image capture operations, light from a scene may be focused onto an image pixel array (e.g., array 20 of image pixels 22) by lens 14. Image sensor 16 provides corresponding digital image data to analog circuitry 31. Analog circuitry 31 may provide processed image data to digital circuitry 32 for further processing. Circuitry 31 and/or 32 may also be used in controlling the operation of image sensor 16. Image sensor 16 may, for example, be a backside illumination image sensor. If desired, camera module 12 may be provided with an array of lenses 14 and an array of corresponding image sensors 16.

Device 10 may include additional control circuitry such as storage and processing circuitry 18. Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 20 of image pixels 22. Image pixels 22 may be formed in a semiconductor substrate using complementary metal-oxidesemiconductor (CMOS) technology or charge-coupled device (CCD) technology or any other suitable photosensitive devices.

Embodiments of the present invention relate to image sensor pixels configured to support global shutter operation. For example, the image pixels may each include a photodiode, floating diffusion region, and a local storage region. With a global shutter scheme, all of the pixels in an image sensor are reset simultaneously. The transfer operation is then used to simultaneously transfer the charge collected in the photodiode of each image pixel to the associated storage region. Data from each storage region may then be read out on a per-row basis.

Figure 2:
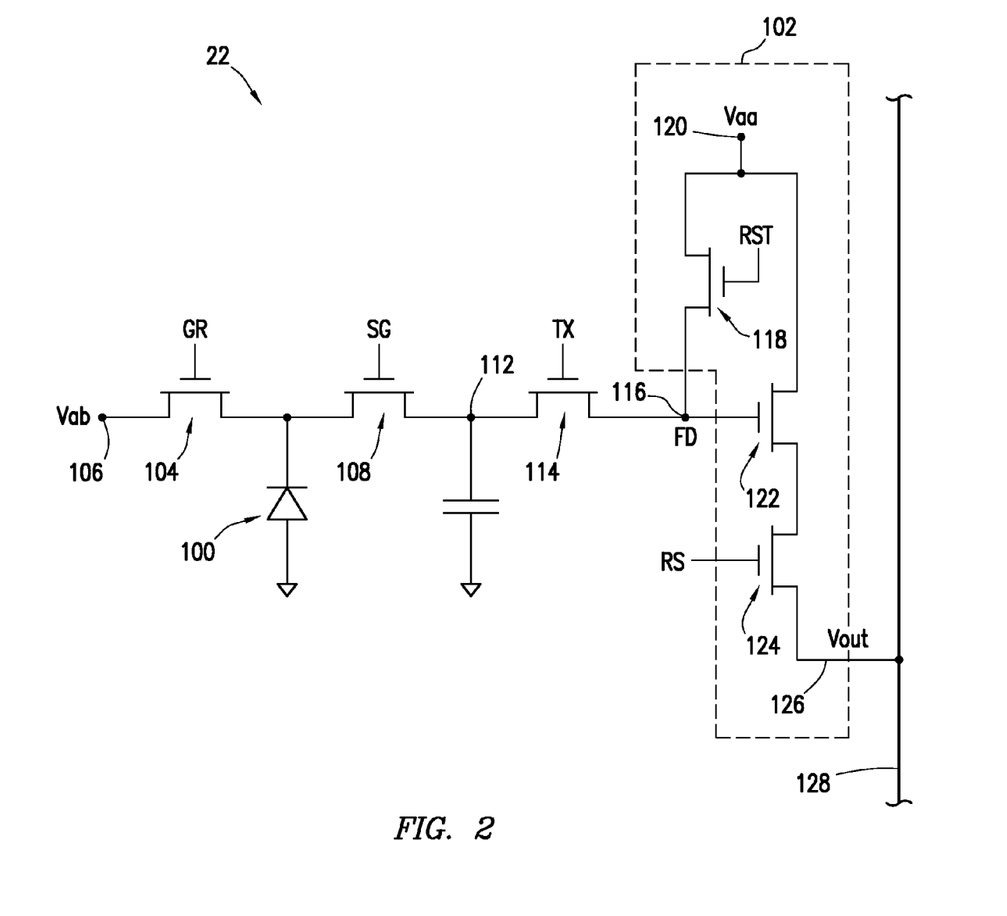
FIG. 2 is a diagram of an illustrative image sensor pixel that may be used to support global shutter operation in accordance with an embodiment.

FIG. 2 is a circuit diagram of an illustrative image sensor pixel 22 operable in global shutter mode. As shown in FIG. 2, pixel 22 may include a photosensitive element such as photodiode 100. A first (positive) power supply voltage Vaa may be supplied at positive power supply terminal 120. A second power supply voltage Vab may be supplied at second power supply terminal 106. Incoming light may be collected by photodiode 100. Photodiode 100 may then generate charge (e.g., electrons) in response to receiving impinging photons. The amount of charge that is collected by photodiode 100 may depend on the intensity of the impinging light and the exposure duration (or integration time).

Before an image is acquired, reset control signal RST may be asserted. Asserting signal RST turns on reset transistor 118 and resets charge storage node 116 (also referred to as floating diffusion region FD) to Vaa. Reset control signal RST may then be deasserted to turn off reset transistor 118. Similarly, prior to charge integration, a global reset signal GR may be pulsed high to reset photodiode 100 to power supply voltage Vab (e.g., by passing Vab to photodiode 100 through global reset transistor 104).

Pixel 22 may further include a storage transistor 108 operable to transfer charge from photodiode 100 to storage node (sometimes called a charge storage region or storage region) 112. Charge storage region 112 may be a doped semiconductor region (e.g., a doped silicon region formed in a silicon substrate by ion implantation, impurity diffusion, or other doping techniques) that is capable of temporarily storing charge transferred from photodiode 100. Region 112 that is capable of temporarily storing transferred charge is sometimes referred to as a "storage diode" (SD).

Pixel 22 may include a transfer gate (transistor) 114. Transfer gate 114 may have a gate terminal that is controlled by transfer control signal TX. Transfer signal TX may be pulsed high to transfer charge from storage diode region 112 to charge storage region 116 (sometimes called a "floating diffusion" region). Floating diffusion (FD) region 116 may be a doped semiconductor region (e.g., a region in a silicon substrate that is doped by ion implantation, impurity diffusion, or other doping processes). Floating diffusion region 116 may serve as another storage region for storing charge during image data gathering operations.

Pixel 22 may also include readout circuitry such as charge readout circuit 102. Charge readout circuit 102 may include row-select transistor 124 and source-follower transistor 122. Transistor 124 may have a gate that is controlled by row select signal RS. When signal RS is asserted, transistor 124 is turned on and a corresponding signal Vout (e.g. an output signal having a magnitude that is proportional to the amount of charge at floating diffusion node 116) is passed onto output path 128.

Image pixel array 20 may include pixels 22 arranged in rows and columns. A column readout path such as output line 128 may be associated with each column of pixels (e.g., each image pixel 22 in a column may be coupled to output line 128 through respective row-select transistors 124). Signal RS may be asserted to read out signal Vout from a selected image pixel onto column readout path 124. Image data Vout may be fed to circuitry 18 for further processing. The circuitry of FIG. 2 is merely illustrative. If desired, pixel 22 may include other pixel circuitry.

Figure 3:
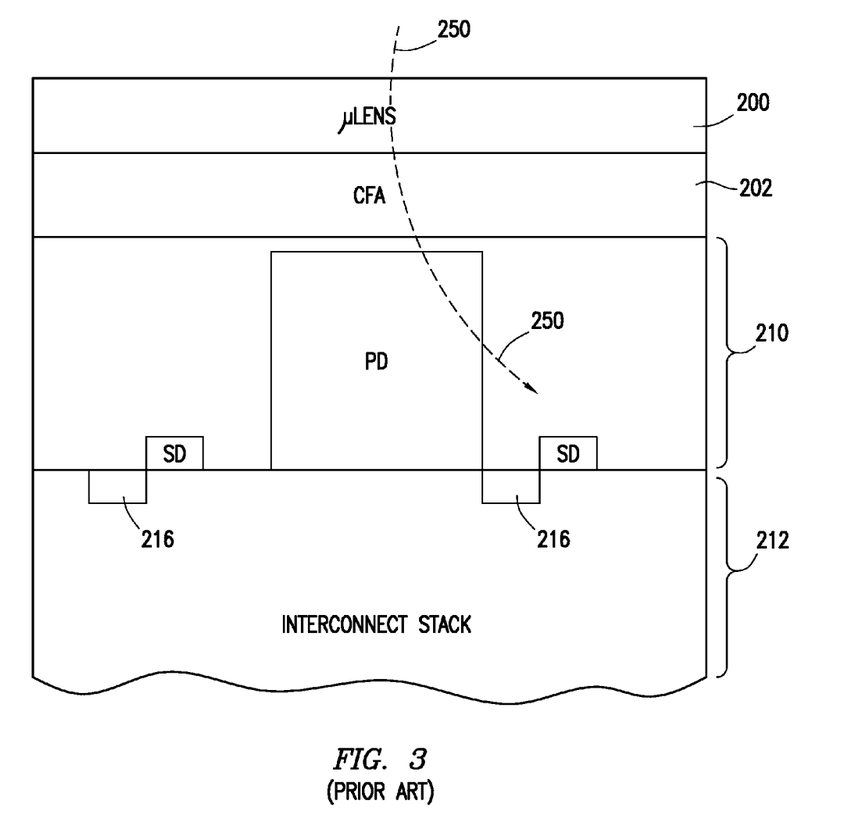
FIG. 3 is a cross-sectional side view of a conventional backside illuminated (BSI) image sensor.

FIG. 3 shows a cross-sectional side view of a conventional backside illuminated (BSI) image sensor. As shown in FIG. 3, photodiode PD associated with a given image sensor pixel, a storage diode region SD associated with the given image sensor pixel, and an additional storage diode region SD associated with an adjacent image sensor pixel are can be formed in a first (front) surface of p-type substrate 210. Gate conductors such as gate conductors 216 of the storage transistors are formed on the front surface of substrate 212.

A dielectric stack 212 is formed on the front surface of substrate 210. Dielectric stack 212 is formed from dielectric material such as silicon oxide. Interconnect routing structures is formed in dielectric stack 212. Dielectric stack 212 is therefore sometimes be referred to as an interconnect stack.

A color filter array 202 is formed on a second (back) surface of substrate 210. A microlens array 200 is typically formed on top of color filter array 202. Microlens array 200 includes an array of individual microlens structures that serve to focus light towards corresponding photodiodes in substrate 210.

Incoming light may enter substrate 210 from the back surface. Image sensor pixels operated in this way are therefore referred to as backside illuminated (BSI) image sensor pixels. In some scenarios, however, light that is intended for the photodiode PD may inadvertently leak into the storage diode region SD or other undesired "dark regions" (i.e., regions that should not be affected by incoming light) in substrate 210. This type of light leakage can result in degraded global shutter efficiency and can even cause image ghosting and smear effects.

In an effort to protect the storage diode region SD from stray light, conventional BSI image sensors sometimes include metal shields formed on the back surface of substrate 212. This technique, however, is not particularly effective for image sensors with thick silicon substrates 210, which are sometimes used to provide higher pixel sensitivity. It may therefore be desirable to provide improved ways for shielding the dark regions in a BSI image sensor.

Figure 4:
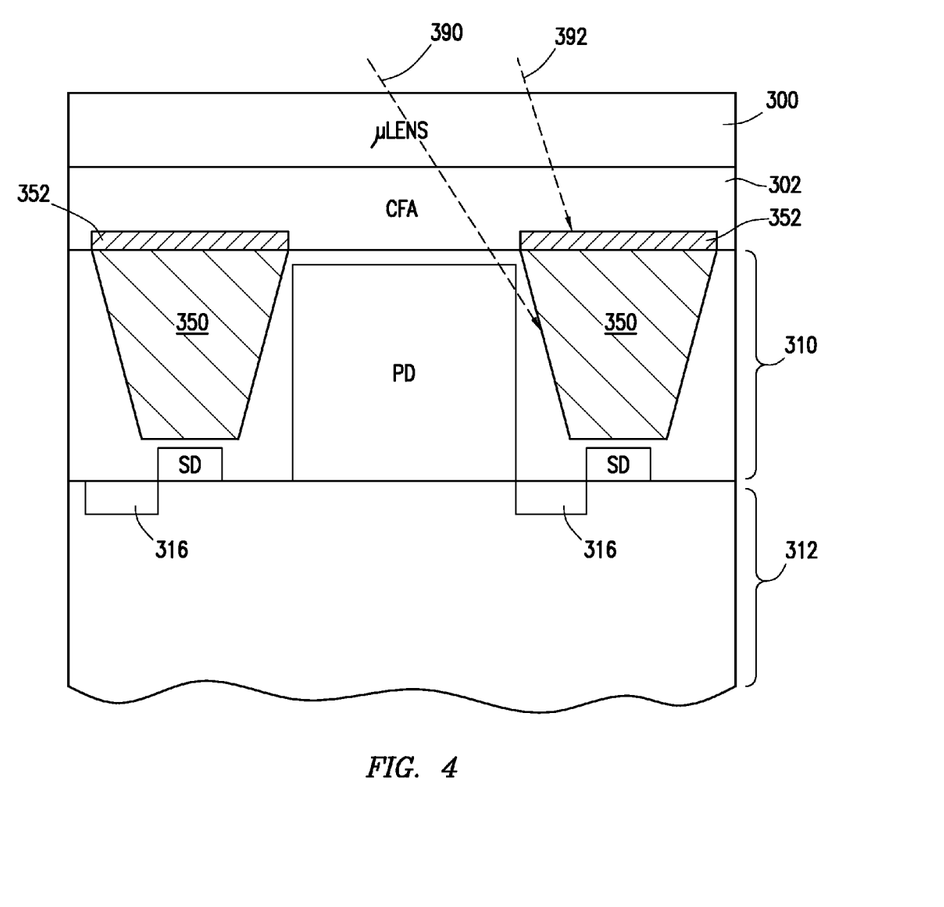
FIG. 4 is a cross-sectional side view of an illustrative backside illuminated (BSI) image sensor having a backside isolation trench structure in accordance with an embodiment.

In accordance with an embodiment of the present invention, image sensor pixels may be provided with backside trench isolation structures to help further shield the dark regions. FIG. 4 is a cross-sectional side view of an illustrative backside illuminated (BSI) image sensor having backside trench isolation structures such as trench isolation structures 350. As shown in FIG. 4, an image sensor pixel may include a photodiode PD and a storage diode SD formed in the front side of a semiconductor substrate 310 (e.g., a p-type substrate). Storage gate conductors such as gate conductors 316 may be formed on the front side of substrate 310.

A dielectric stack 312 may be formed on the front side of substrate 310. Dielectric stack 312 may include alternating metal interconnect routing layers and metal via layers and is therefore sometimes referred to as interconnect layers. In a backside illumination configuration, a color filter array (CFA) 302 (e.g., an array of color filter elements configured to pass different wavelengths of light) may be formed over the back side of substrate 310. Microlens structures 300 (e.g., an array of microlens for focusing light towards respective photodiodes in the substrate) may be formed on the color filter array 302 over the back side of substrate 310.

In particular, trench isolation structures 350 may be formed in the back side (or surface) of substrate 310. Backside trench isolation structures 350 may be formed directly overlapping with the storage diode region SD or other pixel structures that should be in the dark region of the image sensor pixel. Backside trench isolation structures 350 may be formed by digging a trench or cavity in the back surface of substrate 310 and then filling that cavity with optically absorptive material.

The optically absorptive material that is used to fill the cavity to form backside trench isolation structures 350 may have an index of refraction having a real component n that is equal to that of silicon (or whatever material from which semiconductor substrate 310 is formed) and an imaginary component k that is greater than that of silicon (or whatever material from which substrate 310 is formed). For example, the filler material may be formed from amorphous silicon, polysilicon, silicon oxide, silicon nitride, silicon oxynitride, silicon carbide, titanium oxide, metal silicides such as aluminum silicide, tungsten silicide, tantalum silicide, titanium silicide, vanadium silicide, chromium silicide, cobalt silicide, some combination of these materials, or other materials with a suitable refractive index. Configured in this way, incoming light that strike structures 350 can be effectively absorbed without being reflected or scattered towards the dark regions (as indicated by path 390). Backside trench isolation structures 350 are therefore sometimes referred to as absorptive antireflective/antiscattering structures.

Still referring to FIG. 4, an additional layer such as shielding layer 352 may be formed over the backside trench isolation structures at the back surface of substrate 310. Shielding layer 352 may be formed from metal such as tungsten or aluminum, or may also be formed from reflective or opaque material. If desired, shielding layer 352 may also be formed from optically absorptive material. Configured in this way, incoming light that strike shielding layer 352 can be effectively reflected or absorbed (as indicated by path 392).

In certain embodiments, backside trench isolation structures 350 and/or light shielding layer 352 may be biased to some desired voltage level to further enhance the electrical isolation property in the vicinity of the dark regions. For example, the backside trench isolation structures 350 and/or light shielding layer 352 may receive a ground voltage (e.g., zero volts) or a negative voltage to induce a potential barrier that prevents stray charge from leaking between the photodiode PD and the charge storage diode SD. A conductive via (not shown) may be formed from the back side to make electrical contact with trench isolation structures 350 or with light shielding layer 352 (if present) to convey the voltage to these structures. Backside isolation and shielding structures 350 and 352 formed in this way may can help provide improved sensitivity and global shutter efficiency, even for image sensors with thick silicon substrates (since the depth of the backside trench isolation structures 350 can readily scale with the thickness of substrate layer 310).

Figure 5:
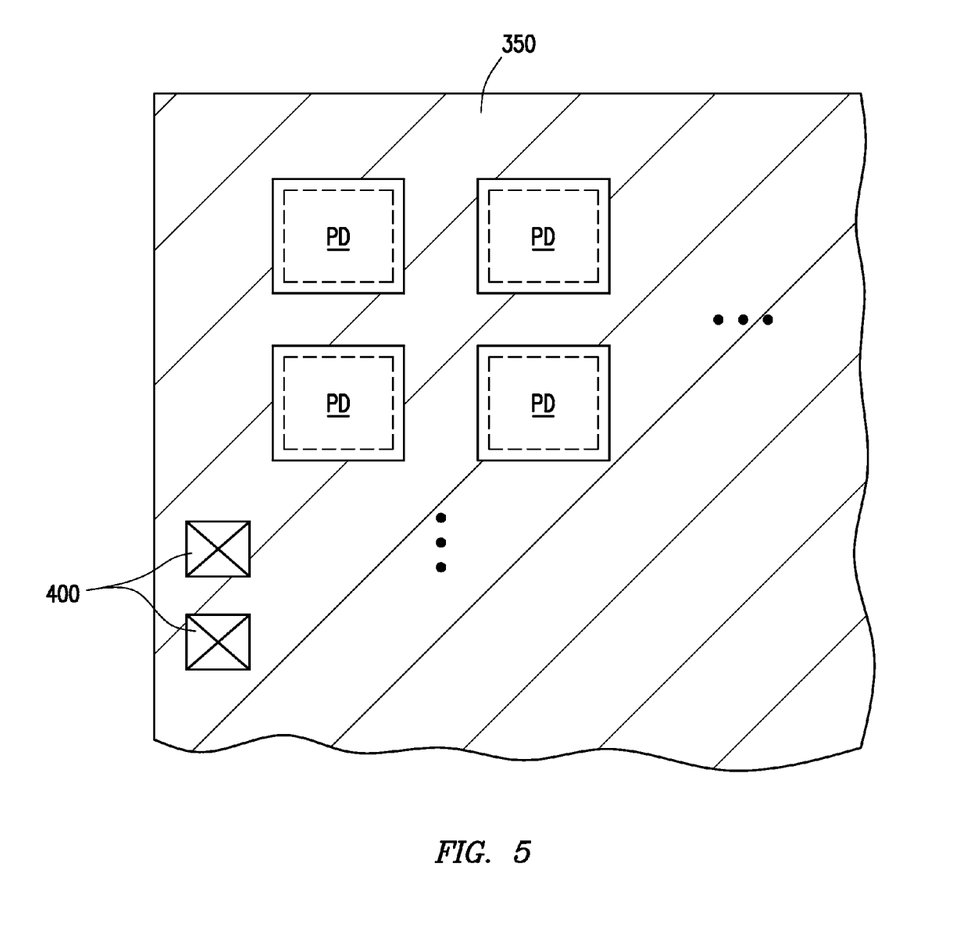
FIG. 5 is a top view showing how the backside isolation trench structure may be formed in a grid-like pattern having openings for respective photodiodes in accordance with an embodiment.

FIG. 5 is a top view showing how the backside isolation trench structure may be formed in a grid-like pattern having openings for respective photodiodes PD in the substrate. As shown in FIG. 5, backside isolation trench structures 350 may be formed in regions over the back surface of the substrate that are non-overlapping with the photodiodes. Contacts such as conductive vias 400 may be formed at the periphery of the array of photodiodes to help bias the backside isolation trench structures 350. The placement of contacts 400 near the edge of the pixel array is merely illustrative. If desired, contacts 400 for conveying the desired bias voltage to the backside isolation trench structures 350 may be interposed between two adjacent photodiodes, at the corner of the pixel array, or other suitable locations on the image sensor.

The example of FIG. 5 does not include light shielding layer 352 of FIG. 4. If light shielding layer 352 were included, light shielding layer 352 would exhibit the same footprint as backside isolation trench structures 350 as shown in FIG. 5 when viewed from above. The examples described herein in which the backside isolation and light shielding layers 350 and 352 are biased to a ground voltage or a negative voltage level are merely illustrative and do not limit the scope of the present invention. If desired, backside trench isolation structure 350 and/or light shielding layer 352 may be biased using a positive voltage, a fixed power supply voltage, or an adjustable control voltage.

Figure 6:
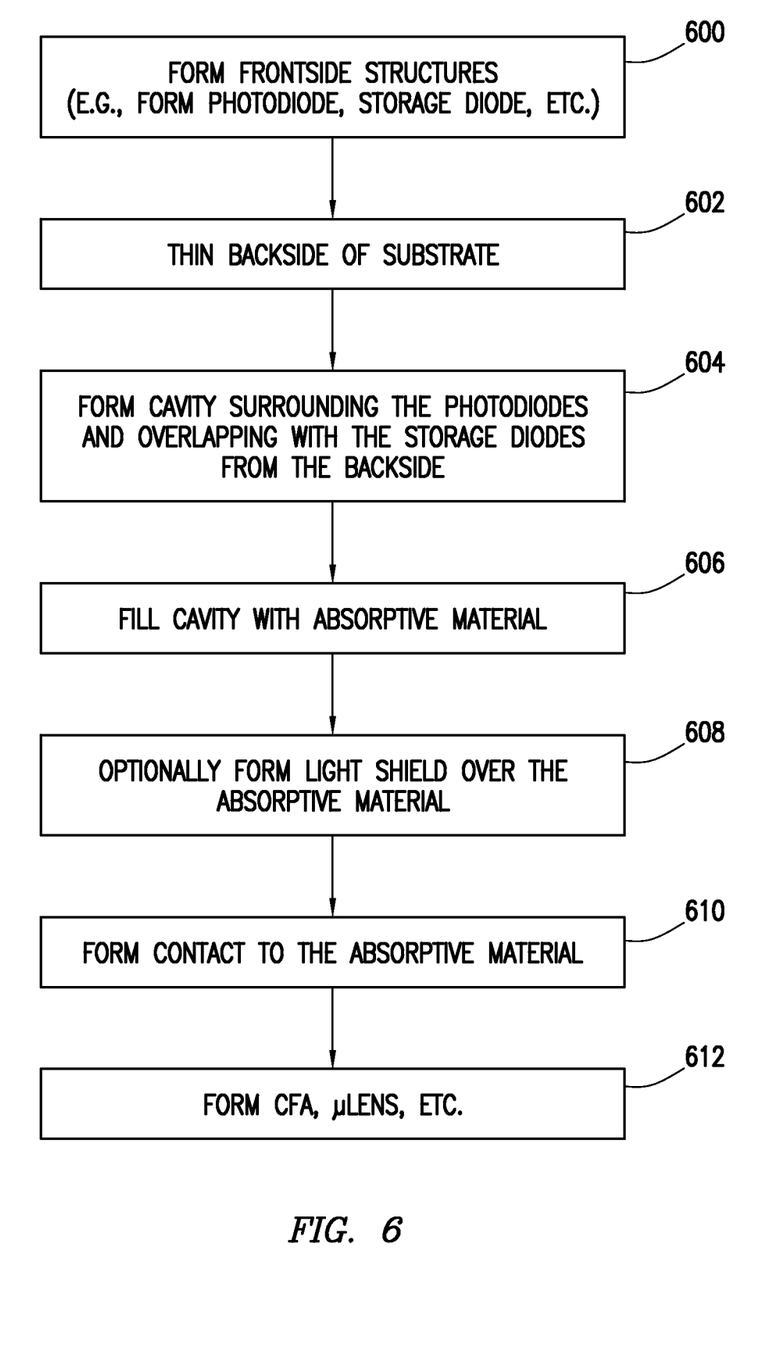
FIG. 6 is a flow chart of illustrative steps for forming the backside isolation trench structures of the type shown in FIGS. 4 and 5 in accordance with an embodiment.

FIG. 6 is a flow chart of illustrative steps for forming the backside isolation trench structures of the type shown in FIGS. 4 and 5. At step 600, pixel structures such as photodiodes PD and storage diodes SD (see, FIG. 4) may be formed at the front side of substrate 310. At step 602, grinding and or polishing operations may be performed to thin the back side of substrate 310 to the desired thickness.

At step 604, selective etching operations may be performed to form a cavity that surround the photodiodes and that directly overlap with the storage diodes from the back side of substrate 310. At step 606, the cavity that was formed during step 604 may be filled with absorptive material to form backside trench isolation structures 350. As an example, the absorptive material may have an index of refraction have a real part (n) that is approximately equal to 3.4 and an imaginary part (k) that is greater than 0.02. The absorptive material may also be conductive.

At step 608, light shielding layer 352 may optionally be formed over the absorptive material. As a result, the light shielding layer 352 may have the same footprint as the cavity that has been filled with absorptive material when viewed from above. The light shielding layer 352 may therefore be formed in a grid-like pattern having holes that align with each of the respective photodiodes. The light shielding layer 352 may be formed from material that is reflective, absorptive, and/or conductive.

At step 610, conductive vias such as contacts 400 (see, FIG. 5) may be formed to make contact with the backside trench isolation structures 350 (or with the light shields 352 if present). The contacts 400 may be used to provide a ground voltage or negative voltage to the backside isolation and shielding structures.

At step 612, a color filter array, microlens structures, and other passivation layers may be formed over the back side of substrate 310 to complete the BSI image sensor.

The embodiments described thus far relate to image sensors operating in global shutter mode. If desired, the embodiments of the present invention can also be applied to image sensors operating in rolling shutter mode to help reduce optical pixel leakage into the floating diffusion region.

Figure 7:
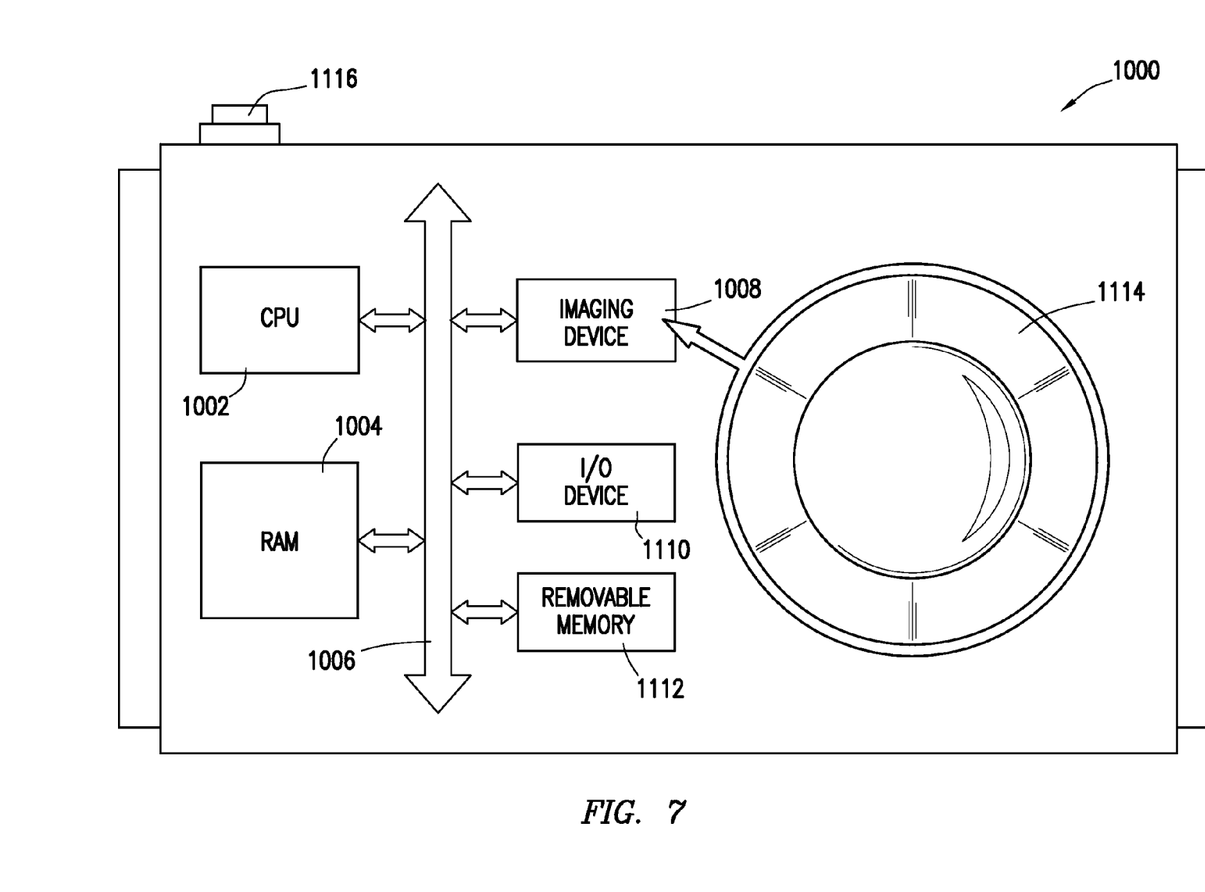
FIG. 7 is a block diagram of a processor system that may employ some of the embodiments of FIGS. 4-6 in accordance with an embodiment of the present invention.

FIG. 7 is a simplified diagram of an illustrative processor system 1000, such as a digital camera, which includes an imaging device 1008 (e.g., the camera module of FIG. 1) employing an imager having pixels with optical isolation structures as described above. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 1000, for example a digital still or video camera system, generally includes a lens 1114 for focusing an image onto one or more pixel array in imaging device 1008 when a shutter release button 1116 is pressed and a central processing unit (CPU) 1002 such as a microprocessor which controls camera and one or more image flow functions. Processing unit 1102 can communicate with one or more input-output (I/O) devices 1110 over a system bus 1006. Imaging device 1008 may also communicate with CPU 1002 over bus 1006. System 1000 may also include random access memory (RAM) 1004 and can optionally include removable memory 1112, such as flash memory, which can also communicate with CPU 1002 over the bus 1006. Imaging device 1008 may be combined with the CPU, with or without memory storage on a single integrated circuit or on a different chip. Although bus 1006 is illustrated as a single bus, it may be one or more busses, bridges or other communication paths used to interconnect system components of system 1000.

Various embodiments have been described illustrating imaging systems with conductively biased isolation structures. A system may include an image sensor module with an array of image sensor pixels and one or more lenses that focus light onto the array of image sensor pixels (e.g., image pixels arranged in rows and columns).

In accordance with an embodiment, the image sensor may include a substrate having a front surface and a back surface, a first charge storage region (e.g., a photodiode) that is formed in the front surface of the substrate, a second charge storage region (e.g., a storage diode) that is formed in the front surface of the substrate, and a trench isolation structure that is formed in the back surface of the substrate. The trench isolation structure may overlap with only one of the first and second charge storage regions.

The trench isolation structure may be formed from a material that exhibits the same refractive index as the substrate. In particular, the substrate may exhibit a first refractive index having a real part and an imaginary part, whereas the trench isolation structure is filled with a material that exhibits a second refractive index having a real part that is equal to the real part of the first refractive index and an imaginary part that is greater than the imaginary part of the first refractive index. For example, the trench isolation structure may be formed from a material selected from the group consisting of: polysilicon, silicon nitride, silicon oxynitride, silicon carbide, titanium oxide, aluminum silicide, tungsten silicide, tantalum silicide, titanium silicide, vanadium silicide, chromium silicide, and cobalt silicide.

If desired, the trench isolation structure may also be conductive. Conductive vias may be formed from the back surface to make electrical contact with the trench isolation structure so that the trench isolation structure receives a selected one of a ground voltage and a negative voltage. In accordance with another embodiment, a light shielding layer may also be formed on the trench isolation structure at the back surface of the substrate. The light shielding layer may only overlap with the backside trench isolation structure.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
   a substrate having a front surface and a back surface;
   a first charge storage region that is formed in the front surface of the substrate;
   a second charge storage region that is formed in the front surface of the substrate; and
   a trench isolation structure that is formed in the back surface of the substrate, wherein the trench isolation extends from the back surface to a first depth in the substrate, wherein the second charge storage region extends from a second depth in the substrate to the front surface, wherein the trench isolation structure overlaps with the second charge storage region without overlapping the first charge storage region, and wherein the second depth is further from the back surface than the first depth.

2. The image sensor defined in claim 1, wherein the trench isolation structure is formed from a material that exhibits the same refractive index as the substrate.

3. The image sensor defined in claim 1, wherein the trench isolation structure is formed from a material selected from the group consisting of: polysilicon, silicon nitride, silicon oxynitride, silicon carbide, titanium oxide, aluminum silicide, tungsten silicide, tantalum silicide, titanium silicide, vanadium silicide, chromium silicide, and cobalt silicide.

4. The image sensor defined in claim 1, wherein the trench isolation structure is conductive.

5. The image sensor defined in claim 4, wherein the trench isolation structure is configured to receive a selected one of a ground voltage and a negative voltage.

6. The image sensor defined in claim 5, further comprising:
   a light shielding layer that is formed on the trench isolation structure at the back surface of the substrate and that has an opening for the first charge storage region.

7. A method of forming an image sensor on a substrate having a front side and a back side, comprising:
   forming a photodiode in the front side of the substrate;
   forming a storage diode in the front side of the substrate;
   forming a cavity in the back side of the substrate; and
   filling the cavity to form a backside trench isolation structure, wherein the backside trench isolation structure extends from the back side to a first depth in the substrate, the storage diode extends from a second depth in the substrate to the front side, and the second depth is further from the back side than the first depth.

8. The method defined in claim 7, further comprising:
   polishing the back side of the substrate to thin the substrate before forming the cavity.

9. The method defined in claim 7, wherein the cavity is filled with optically absorptive material.

10. The method defined in claim 7, wherein the cavity is filled with optically absorptive and conductive material.

11. The method defined in claim 7, further comprising:
    forming a via to make electrical contact with the backside trench isolation structure.

12. The method defined in claim 7, further comprising:
    forming a light shielding layer that only overlaps with the backside trench isolation structure on the back side of the substrate.

13. The method defined in claim 7, further comprising:
    forming a color filter array over the back side of the substrate.

14. A system, comprising:
    a central processing unit;
    memory;
    a lens;
    input-output circuitry; and an imaging device, wherein the imaging device comprises:
 a substrate having a first refractive index associated with a first real part;
 a photodiode formed in the substrate;
 a storage diode formed in the substrate; and
 a trench isolation structure that is formed in the substrate and that overlaps with the storage diode, wherein the trench isolation structure is filled with a material having a second refractive index associated with a second real part that is substantially equal to the first real part.

15. The system defined in claim 14, wherein the substrate has a first surface and a second opposing surface, wherein the photodiode and the storage diode are formed in the first surface of the substrate, and wherein the trench isolation structure is formed in the second surface of the substrate directly over the storage diode.

16. The system defined in claim 15, wherein the imaging device further comprises:
 microlens structures formed over the second surface of the substrate.

17. The system defined in claim 15, wherein the first refractive index is associated with a first imaginary part, and wherein the second refractive index is associated with a second imaginary part that is greater than the first imaginary part.

18. The system defined in claim 15, wherein the imaging device further comprises:
 a light shielding structure that is formed over the trench isolation structure on the second surface of the substrate.

* * * * *